US012699150B2

(12) United States Patent
Zheng et al.

(10) Patent No.:  US 12,699,150 B2
(45) Date of Patent:        Aug. 4, 2026

(54) FAULT DETECTION METHOD AND FAULT PROTECTION METHOD FOR POWER CONVERSION SYSTEM, AND POWER CONVERSION SYSTEM

(71) Applicant: Sungrow Power Supply Co., Ltd., Hefei (CN)

(72) Inventors: Feiyang Zheng, Hefei (CN); Kai Deng, Hefei (CN); Le Li, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 175 days.

(21) Appl. No.: 18/810,787

(22) Filed: Aug. 21, 2024

(65) Prior Publication Data

US 2025/0102595 A1      Mar. 27, 2025

(30) Foreign Application Priority Data

Sep. 26, 2023    (CN) .......................... 202311259348.8

(51) Int. Cl.
*G01R 31/52*          (2020.01)
*H02M 5/04*          (2006.01)
(52) U.S. Cl.
CPC .............. *G01R 31/52* (2020.01); *H02M 5/04* (2013.01)
(58) Field of Classification Search
CPC ................................. G01R 31/52; H02M 5/04
See application file for complete search history.

(56) References Cited

U.S. PATENT DOCUMENTS 10,693,367 B1      6/2020  Chatterjee et al.
2006/0171182 A1*   8/2006  Siri ................... H02M 3/33592
                                                363/131
(Continued)

FOREIGN PATENT DOCUMENTS

CN          106058909 A      10/2016
CN          106340900 A       1/2017
(Continued)

OTHER PUBLICATIONS

Extended European Search Report for European Application No. 24192146.9, dated Jan. 28, 2025.
(Continued)

*Primary Examiner* — Rafael O De Leon Domenech
(74) *Attorney, Agent, or Firm* — Wolf, Greenfield & Sacks, P.C.

(57)                ABSTRACT
A fault detection method and a fault protection method for a power conversion system, and a power conversion system are provided, which relate to the technical field of fault detection for circuits. The fault detection method includes: controlling, when the power conversion system operates in a reactive mode, an alternating current pre-charge power supply to operate to charge a bus capacitor of the power conversion system, where the bus capacitor supplies power to a digital signal processor (DSP) through a first switch power supply (SPS), determining whether the DSP is energized to obtain a first determination result, and determining that the bus capacitor is short-circuited if the first determination result indicates that the DSP is de-energized. According to the present disclosure, when the bus capacitor of the power conversion system is short-circuited, the short-circuit fault of the bus capacitor can be detected.

14 Claims, 5 Drawing Sheets

Battery                          Direct current side of power conversion system

(56) References Cited

U.S. PATENT DOCUMENTS

| 2015/0185271 A1 | 7/2015 | Kim et al. | |
|---|---|---|---|
| 2016/0234921 A1* | 8/2016 | Tabata | C01B 13/11 |
| 2016/0234922 A1* | 8/2016 | Tabata | C01B 13/11 |
| 2016/0234923 A1* | 8/2016 | Tabata | C01B 13/11 |
| 2016/0234925 A1* | 8/2016 | Tabata | C01B 13/11 |
| 2023/0098996 A1* | 3/2023 | Tseng | H04B 1/40 |
| | | | 714/39 |
| 2023/0283169 A1* | 9/2023 | Chen | H02M 1/32 |
| | | | 363/37 |
| 2023/0291303 A1 | 9/2023 | Unru et al. | |
| 2024/0223070 A1 | 7/2024 | Nakagawa | |

FOREIGN PATENT DOCUMENTS

| GB | 2564700 A | 1/2019 |
|---|---|---|
| WO | WO 2017/033411 A1 | 3/2017 |
| WO | WO 2017/204938 A1 | 11/2017 |
| WO | WO 2022/239122 A1 | 11/2022 |

OTHER PUBLICATIONS

First Examination Report for Australian Patent Application No. 2024205214, dated Mar. 24, 2025.

* cited by examiner

FAULT DETECTION METHOD AND FAULT PROTECTION METHOD FOR POWER CONVERSION SYSTEM, AND POWER CONVERSION SYSTEM

The present application claims priority to Chinese Patent Application No. 202311259348.8, titled "FAULT DETECTION METHOD AND FAULT PROTECTION METHOD FOR POWER CONVERSION SYSTEM, AND POWER CONVERSION SYSTEM", filed on Sep. 26, 2023 with the China National Intellectual Property Administration, which is incorporated herein by reference in its entirety.

FIELD

The present disclosure relates to the technical field of fault detection for circuits, and in particular to a fault detection method and a fault protection method for a power conversion system, and a power conversion system.

BACKGROUND

At present, an alternating current pre-charge power supply is used to enable a power conversion system to operate in a reactive mode without consuming energy of a battery rack. That is, when the power conversion system operates in the reactive mode, the battery rack does not operate in relevant circuits. In such case, when a bus capacitor of the power conversion system is short-circuited, there is short-circuit current flowing through a circuit where the bus capacitor and the alternating current pre-charge power supply are arranged. The alternating current pre-charge power supply is prone to be damaged by the short-circuit current.

Therefore, how to perform fault detection on the power conversion system is a technical problem to be solved urgently.

SUMMARY

In order to solve the problem that it is difficult to perform fault detection on a power conversion system in the conventional technology, a fault detection method and a fault protection method for a power conversion system, and a power conversion system are provided according to the present disclosure.

The following technical solutions are provided according to the present disclosure.

A fault detection method for a power conversion system is provided according to the present disclosure. The fault detection method includes: controlling, when the power conversion system operates in a reactive mode, an alternating current pre-charge power supply to operate to charge a bus capacitor of the power conversion system, where the bus capacitor supplies power to a digital signal processor (DSP) through a first switch power supply (SPS); determining whether the DSP is energized to obtain a first determination result; and determining that the bus capacitor is short-circuited if the first determination result indicates that the DSP is de-energized.

In an embodiment, after the determining whether the DSP is energized to obtain a first determination result, the fault detection method for a power conversion system further includes: controlling a first preset power supply to supply power to the DSP through the first SPS, if the first determination result indicates that the DSP is de-energized; re-determining whether the DSP is energized to obtain a second determination result; and determining that the bus capacitor is short-circuited, if the second determination result indicates that the DSP is energized.

In an embodiment, the fault detection method for a power conversion system further includes: determining that the first SPS fails, if the second determination result indicates that the DSP is de-energized.

In an embodiment, after the re-determining whether the DSP is energized to obtain a second determination result, the fault detection method for a power conversion system further includes: controlling a second preset power supply to charge the bus capacitor, if the second determination result indicates that the DSP is energized; determining whether there is a voltage on a direct current bus of the power conversion system to obtain a third determination result; and determining that the bus capacitor is short-circuited, if the third determination result indicates that there is no voltage on the direct current bus.

In an embodiment, the fault detection method for a power conversion system further includes: determining that the alternating current pre-charge power supply fails, if the third determination result indicates that there is a voltage on the direct current bus.

In an embodiment, before the controlling an alternating current pre-charge power supply to operate, the fault detection method for a power conversion system further includes: determining whether a processor of the power conversion system is communicatively connected to a battery management system (BMS); and controlling the alternating current pre-charge power supply to operate, in a case of determining that the processor is communicatively connected to the BMS.

In an embodiment, after the determining whether a processor of the power conversion system is communicatively connected to a BMS, the fault detection method for a power conversion system further includes: determining that there is a communication failure between the processor and the BMS, in a case of determining that the processor fails to be communicatively connected to the BMS.

In an embodiment, the determining whether the DSP is energized includes: determining whether the DSP is communicatively connected to a processor of the power conversion system; determining that the DSP is energized, in a case of determining that the DSP is communicatively connected to the processor of the power conversion system; and determining that the DSP is de-energized, in a case of determining that the DSP fails to be communicatively connected to the processor of the power conversion system.

A fault protection method for a power conversion system is further provided according to the present disclosure. The fault protection method includes: controlling, during fault detection on the power conversion system with the fault detection method for a power conversion system described above, the alternating current pre-charge power supply to stop operating when it is determined that the DSP is de-energized for a first time.

In an embodiment, the fault protection method for a power conversion system further includes: controlling the power conversion system to stop operating when it is determined that the bus capacitor of the power conversion system is short-circuited, when it is determined that the alternating current pre-charge power supply fails, or when it is determined that the first SPS fails.

A power conversion system is further provided according to the present disclosure. The power conversion system includes a main circuit, a first SPS, a DSP, a processor, and an alternating current pre-charge power supply. A bus capacitor is connected between a positive electrode and a negative electrode of a battery side of the main circuit, and the bus capacitor is connected to an input end of the first SPS. The first SPS is configured to supply power to the DSP. An output end of the alternating current pre-charge power supply is connected to the bus capacitor, and the alternating current pre-charge power supply is controlled by the processor. The processor is communicatively connected to the DSP and a BMS. The processor is configured to: control a first preset power supply through the BMS to supply power to the first SPS; and perform the fault detection method for a power conversion system described above, to implement fault detection on the power conversion system.

In an embodiment, the BMS is powered by an external second SPS and configured to supply power to the processor.

In an embodiment, a positive electrode of the bus capacitor is connected to a positive electrode of the input end of the first SPS through a first diode, and the first preset power supply is configured to supply power to the first SPS through a second diode.

In an embodiment, a negative electrode of the input end of the first SPS is connected to a negative electrode of the output end of the alternating current pre-charge power supply through a third diode, and a negative electrode of the bus capacitor is connected to the negative electrode of the output end of the alternating current pre-charge power supply through a fourth diode.

The above technical solutions according to the present disclosure have the following beneficial effects.

When the power conversion system operates in a reactive mode, the alternating current pre-charge power supply is controlled to charge the bus capacitor of the power conversion system, and the bus capacitor supplies power to the DSP through the first SPS. When the bus capacitor is short-circuited, the bus capacitor is equivalent to a wire. In such case, current flows from the positive electrode of the output end of the alternating current pre-charge power supply to the negative electrode of the output end of the alternating current pre-charge power supply through the bus capacitor, rather than flowing to the DSP 12, that is, the circuit where the bus capacitor and the alternating current pre-charge power supply are arranged is short-circuited. Therefore, the DSP is de-energized.

Based on such principle, in the present disclosure, when the power conversion system operates in the reactive mode, the alternating current pre-charge power supply is controlled to operate to charge the bus capacitor of the power conversion system, and the bus capacitor supplies power to the DSP through the first SPS. It is determined whether the DSP is energized to obtain the first determination result. If the first determination result indicates that the DSP is de-energized, it is determined that the bus capacitor is short-circuited. In this way, according to the present disclosure, when the bus capacitor of the power conversion system is short-circuited, the short-circuit fault of the bus capacitor can be detected, so as to perform fault protection based on a fault detection result, thereby preventing the alternating current pre-charge power supply from being damaged by short-circuit current generated due to the short-circuit fault of the bus capacitor.

BRIEF DESCRIPTION OF THE DRAWINGS

In order to more clearly illustrate technical solutions in embodiments of the present disclosure or in the conventional technology, drawings to be used in the description of the embodiments or the conventional technology are briefly described hereinafter. It is apparent that the drawings described below show only the embodiments of the present disclosure, and other drawings may be obtained by those skilled in the art from the drawings without any creative work.

DETAILED DESCRIPTION OF EMBODIMENTS

Technical solutions of embodiments of the present disclosure are described below clearly and completely in conjunction with the drawings of the embodiments of the present disclosure. Apparently, the embodiments described below are only some embodiments of the present disclosure, rather than all the embodiments. Any other embodiments obtained by those skilled in the art based on the embodiments of the present disclosure without any creative effort fall within the protection scope of the present disclosure.

At present, an alternating current pre-charge power supply is used to enable a power conversion system to operate in a reactive mode without consuming energy of a battery rack. That is, when the power conversion system operates in the reactive mode, the battery rack does not operate in relevant circuits. In such case, when a bus capacitor of the power conversion system is short-circuited, there is short-circuit current flowing through a circuit where the bus capacitor and the alternating current pre-charge power supply are arranged. The alternating current pre-charge power supply is prone to be damaged by the short-circuit current. In addition, when the bus capacitor is short-circuited, the power conversion system fails to operate normally.

A fault detection method and a fault protection method for a power conversion system, and a power conversion system are provided according to the present disclosure, in order to detect a short-circuit fault of the bus capacitor when the bus capacitor of the power conversion system is short-circuited, so as to perform fault protection and fault handling based on a fault detection result, thereby preventing the alternating current pre-charge power supply from being damaged by the short-circuit current generated due to the short-circuit fault of the bus capacitor, and avoiding affecting the normal operation of the power conversion system by the short-circuit fault of the bus capacitor.

The technical solutions according to the present disclosure are described in detail below in conjunction with the drawings.

Figure 1:
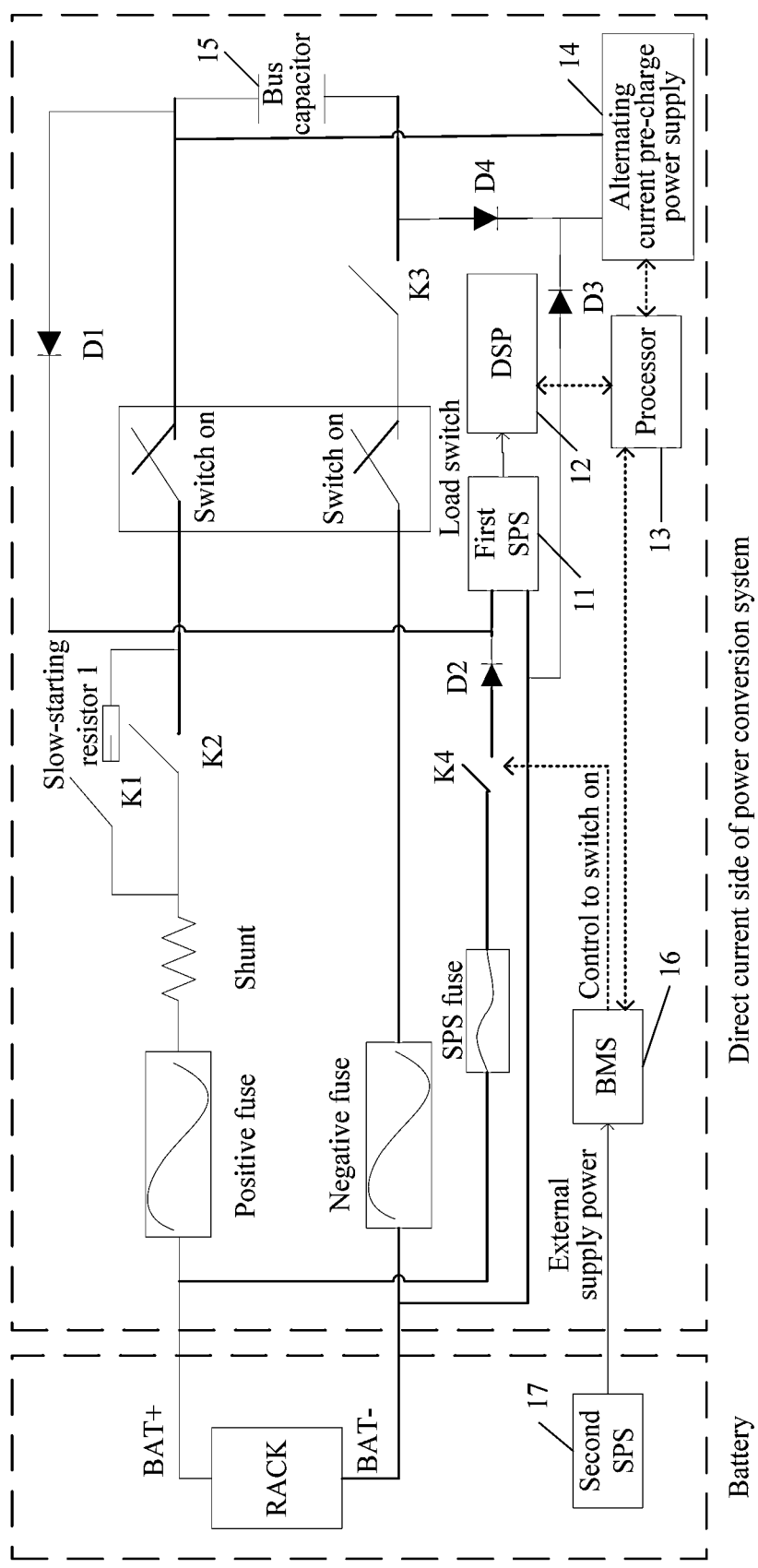
FIG. 1 is a schematic diagram of a circuit structure of a power conversion system according to an embodiment of the present disclosure.

FIG. 1 is a schematic diagram of a circuit structure of a power conversion system according to an embodiment of the present disclosure. As shown in FIG. 1, the power conversion system includes a main circuit, a first SPS 11, a DSP 12, a processor 13 and an alternating current pre-charge power supply 14.

A bus capacitor 15 is connected between a positive electrode and a negative electrode of a battery side of the main circuit, and the bus capacitor 15 is connected to an input end of the first SPS 11. The first SPS 11 is configured to supply power to the DSP 12.

An output end of the alternating current pre-charge power supply 14 is connected to the bus capacitor 15, and the alternating current pre-charge power supply 14 is controlled by the processor 13.

The processor 13 is communicatively connected to the DSP 12 and a BMS 16. The processor 13 is configured to control a first preset power supply through the BMS 16 to supply power to the first SPS 11, and perform the fault detection method for a power conversion system according to the present disclosure, to implement fault detection on the power conversion system.

In the embodiment of the present disclosure, the main circuit is provided with main functional components of the power conversion system. A direct current side, namely the battery side, of the main circuit is configured to connect a battery. In practice, a positive fuse, a negative fuse, a shunt, a main contactor K2, a main contactor K3, a slow-starting contactor K1, a slow-starting resistor, a load switch and the like that are shown in FIG. 1 are connected between the battery and the battery side of the main circuit. In a case that the main circuit is a bidirectional DC-AC conversion circuit, an alternating current side of the main circuit is configured to connect a power grid and/or a load. In a case that the main circuit is a bidirectional DC-DC conversion circuit, the other direct current side of the main circuit is configured to connect to a direct current bus of a photovoltaic inverter. The first SPS 11 is a direct current power supply and is implemented as a DC-DC conversion circuit. The processor 13 is an Advanced RISC Machine (ARM) processor.

The processor 13 controls the alternating current pre-charge power supply 14 to charge the bus capacitor 15. Since the bus capacitor 15 is connected to the input end of the first SPS 11, the bus capacitor 15 supplies power to the DSP 12 through the first SPS 11 after the bus capacitor 15 is charged. The processor 13 further sends a control instruction to the BMS 16, so that the BMS 16 switches on an auxiliary contactor K4 in response to the control instruction. After the auxiliary contactor K4 is switched on, the first preset power supply supplies power to the first SPS 11, so that the first SPS 11 supplies power to the DSP 12. The first preset power supply is shown as RACK in FIG. 1. The BMS 16 is further configured to implement information interaction between the processor 13 and a user.

In the embodiment of the present disclosure, the BMS 16 is powered by an external second SPS 17 and supplies power to the processor 13. In addition, the BMS 16 exchanges information with the processor 13.

In practice, a positive electrode of the bus capacitor 15 is connected to a positive electrode of the input end of the first SPS 11 through a first diode D1, and the first preset power supply supplies power to the first SPS 11 through a second diode D2, to ensure a direction in which current flows through the positive electrode of the input end of the first SPS 11, preventing current from flowing from a power supply with a high voltage among the bus capacitor 15 and the first preset power supply to the other power supply with a low voltage, i.e., current backflow, resulted from that the bus capacitor 15 and the first preset power supply are connected to the input end of the first SPS 11, thereby preventing the power supply to which backflow current flows from being damaged.

Based on a same principle, in the embodiment of the present disclosure, a negative electrode of the input end of the first SPS 11 is connected to a negative electrode of the output end of the alternating current pre-charge power supply 14 through a third diode D3, and a negative electrode of the bus capacitor 15 is connected to the negative electrode of the output end of the alternating current pre-charge power supply 14 through a fourth diode D4, avoiding a problem of a direction in which a current flows resulted from that both the negative electrode of the input end of the first SPS 11 and the negative electrode of the bus capacitor 15 are connected to the negative electrode of the output end of the alternating current pre-charge power supply 14, thereby avoiding current backflow.

Based on a same concept, a fault detection method for a power conversion system is further provided according to the present disclosure. The fault detection method is applied to the processor 13.

Figure 2:
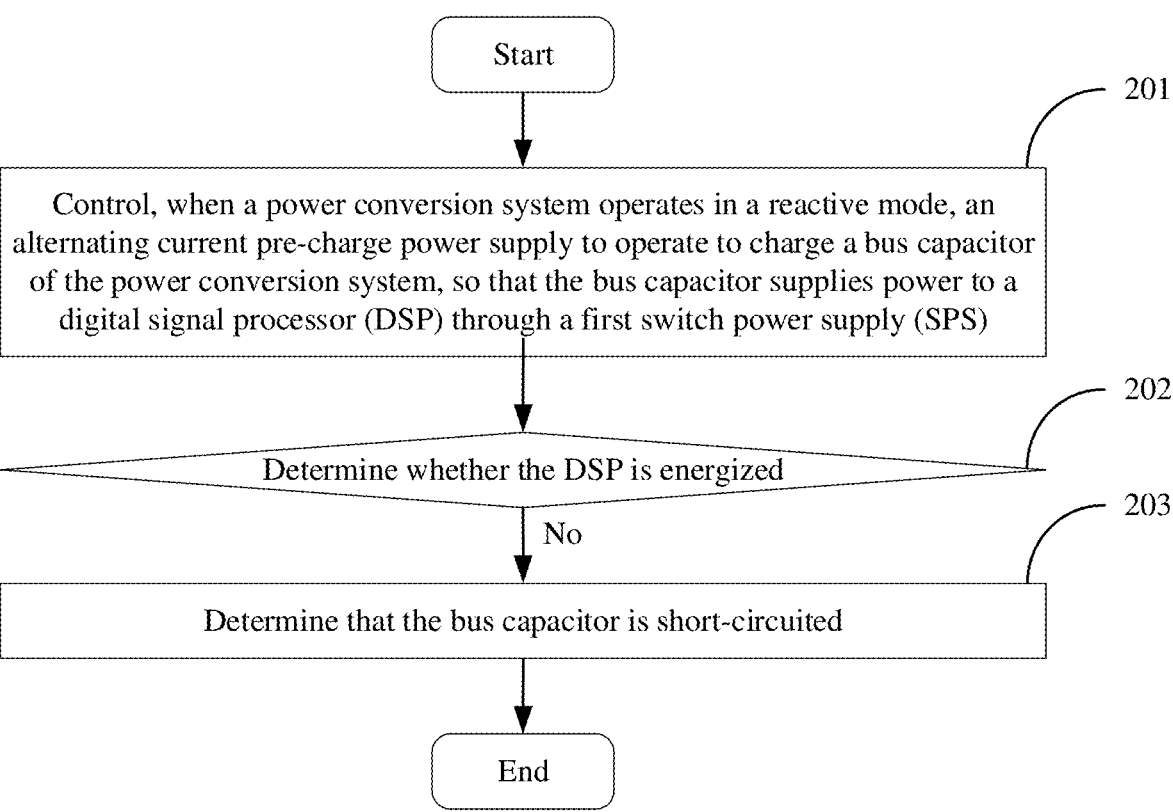
FIG. 2 is a flowchart of a fault detection method for a power conversion system according to an embodiment of the present disclosure.

FIG. 2 is a flowchart of a fault detection method for a power conversion system according to an embodiment of the present disclosure. As shown in FIG. 2, the fault detection method for a power conversion system includes the following steps 201 to 203.

In step 201, when the power conversion system operates in a reactive mode, the alternating current pre-charge power supply is controlled to operate to charge the bus capacitor of the power conversion system, so that the bus capacitor supplies power to the DSP through the first SPS.

In the embodiment of the present disclosure, when the power conversion system operates in the reactive mode, the power conversion system functions as a reactive power compensation device for a power grid system.

In step 202, it is determined whether the DSP is energized to obtain a first determination result. The process proceeds to step 203 if the first determination result indicates that the DSP is de-energized.

In the embodiment of the present disclosure, referring to FIG. 1, the processor 13 is communicatively connected to the DSP 12 when the DSP 12 is energized, and the processor 13 fails to be communicatively connected to the DSP 12 when the DSP 12 is de-energized. Therefore, in step 202, it is determining whether the DSP is energized by: determining whether the DSP is communicatively connected to the processor 13; determining that the DSP is energized, in a case of determining that the DSP is communicatively connected to the processor 13; and determining that the DSP is de-energized, in a case of determining that the DSP fails to be communicatively connected to the processor 13.

In step 203, it is determined that the bus capacitor is short-circuited.

The above technical solutions are provided according to the embodiment of the present disclosure. Referring to FIG. 1, when the bus capacitor 15 is short-circuited, the bus capacitor 15 is equivalent to a wire. In such case, current flows from the positive electrode of the output end of the alternating current pre-charge power supply 14 to the negative electrode of the output end of the alternating current pre-charge power supply 14 through the bus capacitor 15 and the fourth diode D4, rather than flowing to the DSP 12 through the first diode D1 and the first SPS 11. Therefore, the DSP is de-energized.

Based on such principle, in the embodiment of the present disclosure, when the power conversion system operates in the reactive mode, the alternating current pre-charge power supply is controlled to operate to charge the bus capacitor of the power conversion system, so that the bus capacitor supplies power to the DSP through the first SPS. It is determined whether the DSP is energized to obtain the first determination result. If the first determination result indicates that the DSP is de-energized, it is determined that the bus capacitor is short-circuited. In this way, according to the embodiment of the present disclosure, when the bus capacitor of the power conversion system is short-circuited, the short-circuit fault of the bus capacitor can be detected, so as to perform fault protection based on a fault detection result, thereby preventing the alternating current pre-charge power supply from being damaged by the short-circuit current generated due to the short-circuit fault of the bus capacitor and improving the reliability of the power conversion system.

Moreover, when the DSP is de-energized, the power conversion system fails to start and therefore fails to operate normally. In the embodiment of the present disclosure, when the bus capacitor of the power conversion system is short-circuited, the short-circuit fault of the bus capacitor can be detected, so as to perform fault protection based on a fault detection result, thereby avoiding affecting the normal operation of the power conversion system by the short-circuit fault of the bus capacitor.

Figure 3:
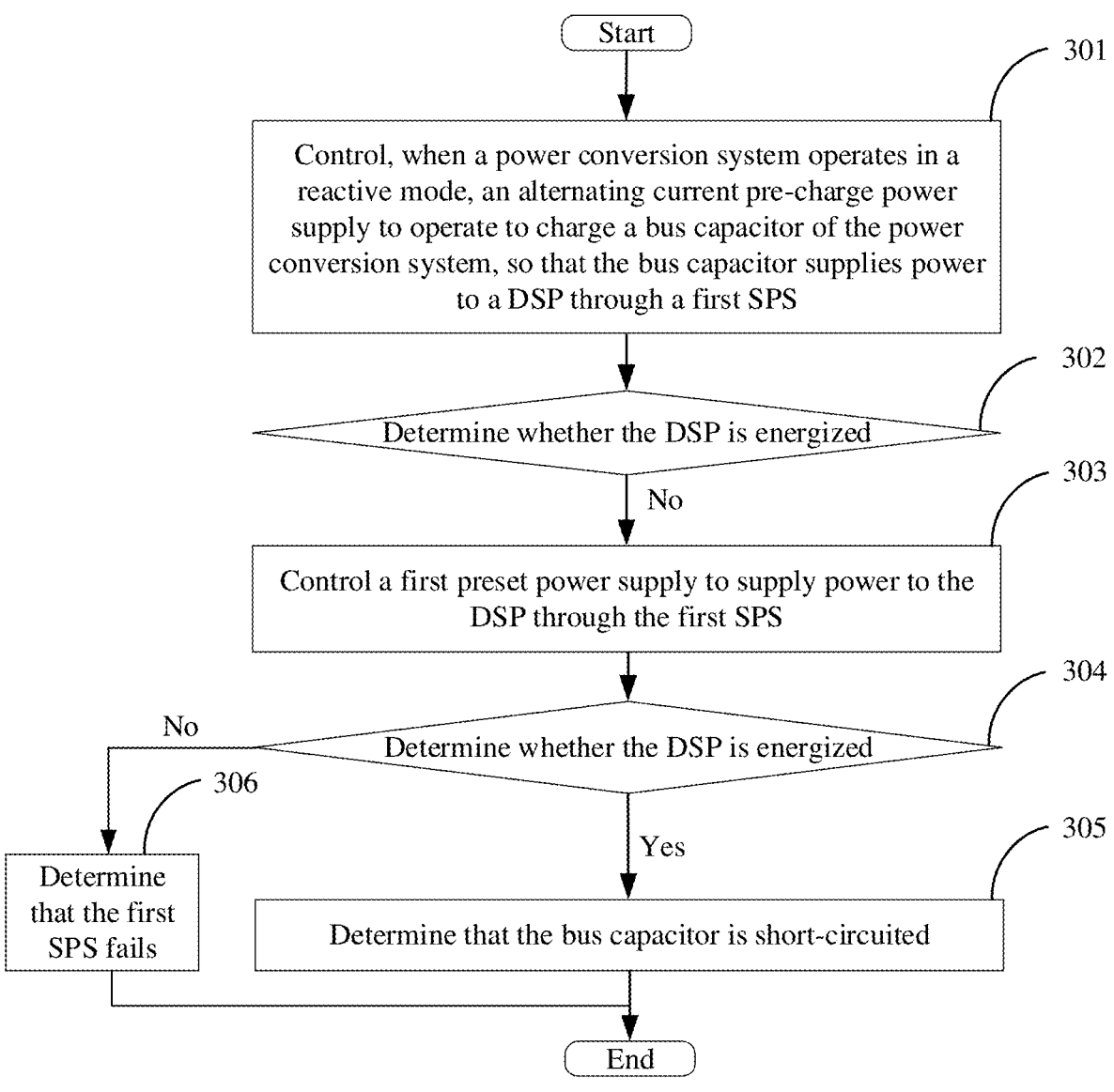
FIG. 3 is a flowchart of a fault detection method for a power conversion system according to another embodiment of the present disclosure.

FIG. 3 is a flowchart of a fault detection method for a power conversion system according to another embodiment of the present disclosure. As shown in FIG. 3, the fault detection method for a power conversion system includes the following steps 301 to 306.

In step 301, when the power conversion system operates in a reactive mode, the alternating current pre-charge power supply is controlled to operate to charge the bus capacitor of the power conversion system, so that the bus capacitor supplies power to the DSP through the first SPS.

In step 302, it is determined whether the DSP is energized to obtain a first determination result. The process proceeds to step 303 if the first determination result indicates that the DSP is de-energized.

In step 303, the first preset power supply is controlled to supply power to the DSP through the first SPS.

In the embodiment of the present disclosure, referring to FIG. 1, in a case that the first preset power supply is shown as RACK in FIG. 1, the processor 13 sends a control instruction to the BMS 16, so that the BMS 16 switches on the auxiliary contactor K4 in response to the control instruction. After the auxiliary contactor K4 is switched on, the first preset power supply supplies power to the first SPS 11, so that the first SPS 11 supplies power to the DSP 12.

In step 304, it is re-determined whether the DSP is energized to obtain a second determination result. The process proceeds to step 305 if the second determination result indicates that the DSP is energized, and the process proceeds to step 306 if the second determination result indicates that the DSP is de-energized.

In step 305, it is determined that the bus capacitor is short-circuited.

In step 306, it is determined that the first SPS fails.

The above technical solutions are provided according to the embodiment of the present disclosure. After the alternating current pre-charge power supply 14 is controlled to charge the bus capacitor 15 to cause the bus capacitor 15 to supply power to the DSP 12 through the first SPS 11, the first preset power supply is controlled to supply power to the DSP 12 through the first SPS 11 if the DSP 12 is de-energized. That is, the first preset power supply, instead of the bus capacitor 15, supplies power to the DSP 12 through the first SPS 11. In such case, if the DSP 12 is energized, it indicates that the first SPS 11 does not fail, and then it is determined that the bus capacitor is short-circuited; and if the DSP 12 is de-energized, it indicates that the first SPS 11 fails.

In this way, according to the embodiment of the present disclosure, in a case that the first SPS 11 fails or the bus capacitor 15 is short-circuited, the fault can be located, which improves the accuracy of the fault detection result and is convenient for maintenance personnel to accurately maintain the power conversion system based on the fault detection result, thereby improving the efficiency of maintenance.

Figure 4:
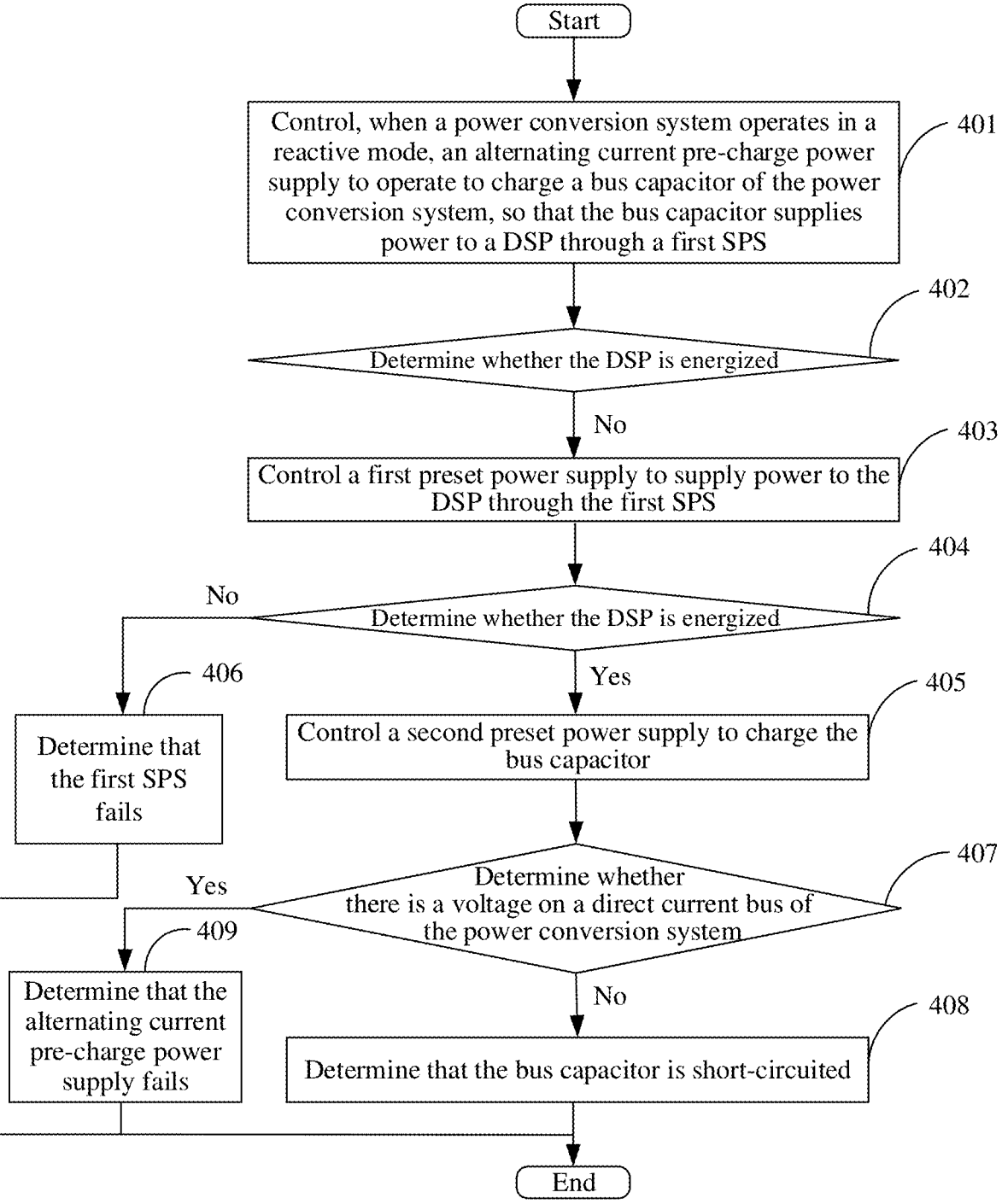
FIG. 4 is a flowchart of a fault detection method for a power conversion system according to another embodiment of the present disclosure.

FIG. 4 is a flowchart of a fault detection method for a power conversion system according to another embodiment of the present disclosure. As shown in FIG. 4, the fault detection method for a power conversion system includes the following steps 401 to 409.

In step 401, when the power conversion system operates in a reactive mode, the alternating current pre-charge power supply is controlled to operate to charge the bus capacitor of the power conversion system, so that the bus capacitor supplies power to the DSP through the first SPS.

In step 402, it is determined whether the DSP is energized to obtain a first determination result. The process proceeds to step 403 if the first determination result indicates that the DSP is de-energized.

In step 403, the first preset power supply is controlled to supply power to the DSP through the first SPS.

In step 404, it is re-determined whether the DSP is energized to obtain a second determination result. The process proceeds to step 405 if the second determination result indicates that the DSP is energized, and the process proceeds to step 406 if the second determination result indicates that the DSP is de-energized.

In step 405, a second preset power supply is controlled to charge the bus capacitor.

In the embodiment of the present disclosure, referring to FIG. 1, the second preset power supply is shown as RACK in FIG. 1. For controlling the second preset power supply to charge the bus capacitor 15, the processor 13 switches on the slow-starting contactor K1 and the main contactor K3, so that the second preset power supply RACK charges the bus capacitor 15.

In step 406, it is determined that the first SPS fails.

In step 407, it is determined whether there is a voltage on a direct current bus of the power conversion system to obtain a third determination result. The process proceeds to step 408 if the third determination result indicates that there is no voltage on the direct current bus, and the process proceeds to step 409 if the third determination result indicates that there is a voltage on the direct current bus.

In step 408, it is determined that the bus capacitor is short-circuited.

In step 409, it is determined that the alternating current pre-charge power supply fails.

The above technical solutions are provided according to the embodiment of the present disclosure. Compared with the fault detection method shown in FIG. 3, in the fault detection method according to this embodiment, if the second determination result indicates that the DSP is energized (that is, the first SPS does not fail), the second preset power supply is controlled to charge the bus capacitor (that is, the second preset power supply, instead of the alternating current pre-charge power supply, charges the bus capacitor). In such case, if there is a voltage on the direct current bus, it indicates that the bus capacitor is not short-circuited (when the bus capacitor is short-circuited, there is no voltage on the direct current bus), and then it is determined that the alternating current pre-charge power supply fails. If there is no voltage on the direct current bus, it is determined that the bus capacitor is short-circuited.

In this way, according to the embodiment of the present disclosure, in a case that the first SPS 11 fails, the bus capacitor 15 is short-circuited, or the alternating current pre-charge power supply 14 fails, the fault can be located, which further improves the accuracy of the fault detection result and is convenient for maintenance personnel to accurately maintain the power conversion system based on the detection result, thereby improving the efficiency of maintenance.

Figure 5:
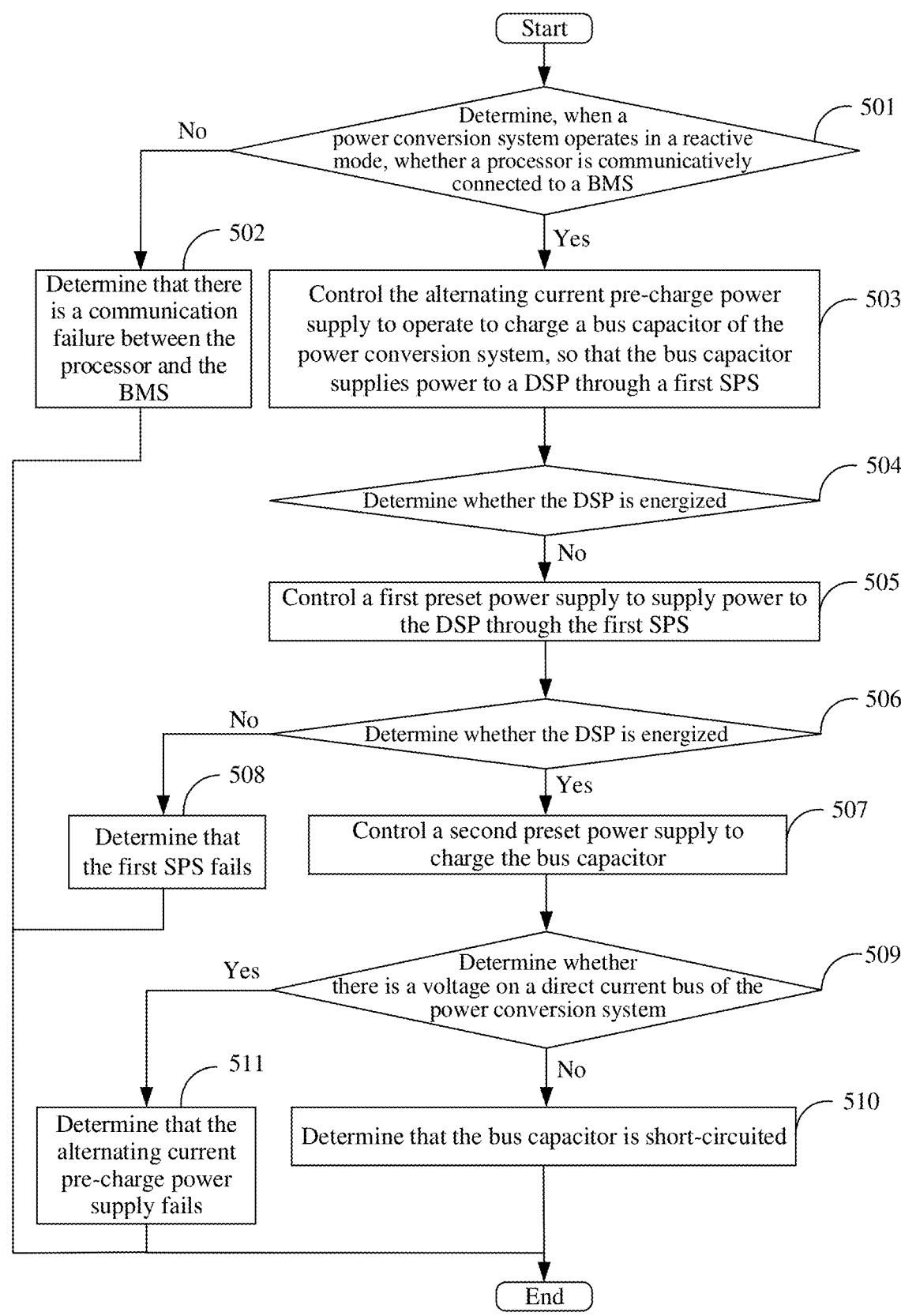
FIG. 5 is a flowchart of a fault detection method for a power conversion system according to another embodiment of the present disclosure.

FIG. 5 is a flowchart of a fault detection method for a power conversion system according to another embodiment of the present disclosure. As shown in FIG. 5, the fault detection method for a power conversion system includes the following steps 501 to 511.

In step 501, when the power conversion system operates in a reactive mode, it is determined whether the processor of the power conversion system is communicatively connected to a BMS. The process proceeds to step 503 in a case of determining that the processor is communicatively connected to the BMS, and the process proceeds to step 502 in a case of determining that the processor fails to be communicatively connected to the BMS.

In the embodiment of the present disclosure, it can be seen from the above descriptions that the processor controls the first preset power supply through the BMS to supply power to the first SPS, so that the first SPS supplies power to the DSP. Moreover, the BMS implements information interaction between the processor and the user. For example, the user sends a fault detection instruction to the BMS. On receipt of the fault detection instruction, the BMS sends the fault detection instruction to the processor. The processor performs the fault detection method for a power conversion system according to the present disclosure in response to the fault detection instruction.

Therefore, it is determined in advance whether the processor is communicatively connected to the BMS and subsequent steps are performed after the processor is communicatively connected to the BMS, which is conducive to successfully performing the fault detection method, thereby improving a success rate of the fault detection and facilitating the user to intervene in the fault detection process.

It should be noted that in the fault detection methods for a power conversion system shown in FIG. 2, FIG. 3 and FIG. 4, it is determined in advance whether the processor is communicatively connected to the BMS before the alternating current pre-charge power supply is controlled to operate, and the subsequent steps are performed after the processor is communicatively connected to the BMS. In a case of determining that the processor fails to be communicatively connected to the BMS, it is directly determined that there is a communication failure between the processor and the BMS, and the fault detection process ends.

In step 502, it is determined that there is a communication failure between the processor and the BMS.

In step 503, the alternating current pre-charge power supply is controlled to operate to charge the bus capacitor of the power conversion system, so that the bus capacitor supplies power to the DSP through the first SPS.

In step 504, it is determined whether the DSP is energized to obtain a first determination result. The process proceeds to step 505 if the first determination result indicates that the DSP is de-energized.

In step 505, the first preset power supply is controlled to supply power to the DSP through the first SPS.

In step 506, it is re-determined whether the DSP is energized to obtain a second determination result. The process proceeds to step 507 if the second determination result indicates that the DSP is energized, and the process proceeds to step 508 if the second determination result indicates that the DSP is de-energized.

In step 507, the second preset power supply is controlled to charge the bus capacitor. In step 508, it is determined that the first SPS fails.

In step 509, it is determined whether there is a voltage on the direct current bus of the power conversion system to obtain a third determination result. The process proceeds to step 510 if the third determination result indicates that there is no voltage on the direct current bus, and the process proceeds to step 511 if the third determination result indicates that there is a voltage on the direct current bus.

In step 510, it is determined that the bus capacitor is short-circuited.

In step 511, it is determined that the alternating current pre-charge power supply fails.

In the embodiment of the present disclosure, before step 501 of determining whether the processor of the power conversion system is communicatively connected to the BMS, the fault detection method for a power conversion system further includes as follows.

It is determined whether the power conversion system operates in the reactive mode. When the power conversion system operates in the reactive mode, the process proceeds to step 501 of determining whether the processor of the power conversion system is communicatively connected to the BMS. When the power conversion system does not operate in the reactive mode, the power conversion system is controlled to operate in the reactive mode, and then the process proceeds to step 501 of determining whether the processor of the power conversion system is communicatively connected to the BMS.

In the embodiment of the present disclosure, after step 504 of determining whether the DSP is energized to obtain a first determination result, the fault detection method for a power conversion system further includes: controlling the power conversion system to operate normally if the first determination result indicates that the DSP is energized.

It should be noted that this solution is also applicable to the fault detection methods for a power conversion system shown in FIG. 2, FIG. 3 and FIG. 4.

Based on a general inventive concept, a fault protection method for a power conversion system is further provided according to the present disclosure. The fault protection method for a power conversion system includes: controlling, during fault detection on the power conversion system with the fault detection method for a power conversion system according to the above embodiments of the present disclosure, the alternating current pre-charge power supply to stop operating when it is determined that the DSP is de-energized for a first time.

In the embodiment of the present disclosure, after it is determined whether the DSP is energized for the first time to obtain the first determination result, the alternating current pre-charge power supply is controlled to stop operating if the first determination result indicates that the DSP is de-energized, preventing the alternating current pre-charge power supply from being damaged by short-circuit current generated due to the short-circuit fault of the bus capacitor.

In the embodiment of the present disclosure, the fault protection method for a power conversion system further includes: controlling the power conversion system to stop operating when it is determined that the bus capacitor of the power conversion system is short-circuited, when it is determined that the alternating current pre-charge power supply fails, or when it is determined that the first SPS fails.

In the embodiments of the present disclosure, the power conversion system is controlled to stop operating after the fault is located, preventing the power conversion system from being damaged, so that the maintenance personnel can perform fault handling on the power conversion system.

The above embodiments of the method are described as combinations of a series of actions for the sake of brevity. However, those skilled in the art should understand that the present disclosure is not limited to the described order of the actions and some of the steps may be performed in another order or simultaneously according to the present disclosure. In addition, those skilled in the art should also understand that the embodiments described in the specification are preferred embodiments, and the actions and modules in the embodiments described are not necessarily required by the present disclosure.

It should be noted that the embodiments in this specification are described in a progressive way, each of the embodiments emphasizes the differences from others, and the same or similar parts among the embodiments can be referred to each other. Since the apparatus disclosed in the embodiments is basically similar to the method therein, the description of the apparatus is relatively simple, and for relevant matters, reference may be made to the description of the embodiments of the method.

Steps in the method according to the various embodiments of the present disclosure may be adjusted, merged or deleted according to actual requirements. Technical features disclosed in the embodiments can be replaced or combined.

It should be further noted that relationship terms such as "first" and "second" herein are only used to distinguish one entity or operation from another entity or operation rather than indicating or implying an actual relation or order between these entities or operations. Moreover, terms "comprise", "include", or any other variation thereof are intended to be non-exclusive. Therefore, a process, method, article or device including a series of elements includes not only the elements but also other elements that are not explicitly listed, or further include elements inherent to the process, method, article or device. Unless expressively limited otherwise, a process, method, article or device limited by "comprising/including a(n) . . . " does not exclude existence of another identical element in such process, method, article or device including the enumerated elements.

Those skilled in the art can implement or practice the present disclosure based on the above description of the disclosed embodiments. Various modifications to these embodiments are apparent to those skilled in the art, and the general principles defined herein can be implemented in other embodiments without departing from the spirit and scope of the present disclosure. Therefore, the present disclosure should not be limited to the embodiments disclosed herein, but has the widest scope in accordance to the principle and the novel features disclosed herein.

The invention claimed is:

1. A fault detection method for a power conversion system, comprising:
   controlling, when the power conversion system operates in a reactive mode, an alternating current pre-charge power supply to operate to charge a bus capacitor of the power conversion system, wherein the bus capacitor supplies power to a digital signal processor (DSP) through a first switch power supply (SPS);
   determining whether the DSP is energized to obtain a first determination result; and determining that the bus capacitor is short-circuited, if the first determination result indicates that the DSP is de-energized.

2. The fault detection method for a power conversion system according to claim 1, wherein after the determining whether the DSP is energized to obtain a first determination result, the method further comprises:
   controlling a first preset power supply to supply power to the DSP through the first SPS, if the first determination result indicates that the DSP is de-energized;
   re-determining whether the DSP is energized to obtain a second determination result; and
   determining that the bus capacitor is short-circuited, if the second determination result indicates that the DSP is energized.

3. The fault detection method for a power conversion system according to claim 2, further comprising:
   determining that the first SPS fails, if the second determination result indicates that the DSP is de-energized.

4. The fault detection method for a power conversion system according to claim 2, wherein after the re-determining whether the DSP is energized to obtain a second determination result, the method further comprises:
   controlling a second preset power supply to charge the bus capacitor, if the second determination result indicates that the DSP is energized;
   determining whether there is a voltage on a direct current bus of the power conversion system to obtain a third determination result; and
   determining that the bus capacitor is short-circuited, if the third determination result indicates that there is no voltage on the direct current bus.

5. The fault detection method for a power conversion system according to claim 4, further comprising:
   determining that the alternating current pre-charge power supply fails, if the third determination result indicates that there is a voltage on the direct current bus.

6. The fault detection method for a power conversion system according to claim 1, wherein before the controlling an alternating current pre-charge power supply to operate, the method further comprises:
   determining whether a processor of the power conversion system is communicatively connected to a battery management system (BMS); and
   controlling the alternating current pre-charge power supply to operate, in a case of determining that the processor is communicatively connected to the BMS.

7. The fault detection method for a power conversion system according to claim 6, wherein after the determining whether a processor of the power conversion system is communicatively connected to a BMS, the method further comprises:
   determining that there is a communication failure between the processor and the BMS, in a case of determining that the processor fails to be communicatively connected to the BMS.

8. The fault detection method for a power conversion system according to claim 1, wherein the determining whether the DSP is energized comprises:
   determining whether the DSP is communicatively connected to a processor of the power conversion system;
   determining that the DSP is energized, in a case of determining that the DSP is communicatively connected to the processor of the power conversion system; and determining that the DSP is de-energized, in a case of determining that the DSP fails to be communicatively connected to the processor of the power conversion system.

9. A fault protection method for a power conversion system, comprising:

controlling, during fault detection on the power conversion system with the fault detection method for a power conversion system according to claim 1, the alternating current pre-charge power supply to stop operating when it is determined that the DSP is de-energized for a first time.

10. The fault protection method for a power conversion system according to claim 9, further comprising:

controlling the power conversion system to stop operating when it is determined that the bus capacitor of the power conversion system is short-circuited, when it is determined that the alternating current pre-charge power supply fails, or when it is determined that the first SPS fails.

11. A power conversion system, comprising:

a DSP;

a first SPS, configured to supply power to the DSP;

a main circuit, wherein a bus capacitor is connected between a positive electrode and a negative electrode of a battery side of the main circuit, and the bus capacitor is connected to an input end of the first SPS;

an alternating current pre-charge power supply, wherein an output end of the alternating current pre-charge power supply is connected to the bus capacitor, and the alternating current pre-charge power supply is controlled by the processor; and a processor, wherein the processor is communicatively connected to the DSP and a BMS, and the processor is configured to: control a first preset power supply through the BMS to supply power to the first SPS; and perform the fault detection method for a power conversion system according to claim 1, to implement fault detection on the power conversion system.

12. The power conversion system according to claim 11, wherein the BMS is powered by an external second SPS and configured to supply power to the processor.

13. The power conversion system according to claim 11, wherein a positive electrode of the bus capacitor is connected to a positive electrode of the input end of the first SPS through a first diode; and the first preset power supply is configured to supply power to the first SPS through a second diode.

14. The power conversion system according to claim 11, wherein a negative electrode of the input end of the first SPS is connected to a negative electrode of the output end of the alternating current pre-charge power supply through a third diode; and a negative electrode of the bus capacitor is connected to the negative electrode of the output end of the alternating current pre-charge power supply through a fourth diode.

* * * * *